US007282931B2

(12) United States Patent
Johnson

(10) Patent No.: US 7,282,931 B2
(45) Date of Patent: Oct. 16, 2007

(54) FULL WAFER CONTACTER AND APPLICATIONS THEREOF

(75) Inventor: Morgan T. Johnson, Portland, OR (US)

(73) Assignee: Octavian Scientific, Inc., Portland, OR (US)

( * ) Notice: Subject to any disclaimer, the term of this patent is extended or adjusted under 35 U.S.C. 154(b) by 56 days.

(21) Appl. No.: 10/789,305

(22) Filed: Feb. 27, 2004

(65) Prior Publication Data

US 2004/0164295 A1 Aug. 26, 2004

Related U.S. Application Data

(63) Continuation-in-part of application No. 10/370,393, filed on Feb. 19, 2003, now Pat. No. 6,991,969.

(60) Provisional application No. 60/450,607, filed on Feb. 28, 2003.

(51) Int. Cl.
*G01R 1/073* (2006.01)
*G01R 31/28* (2006.01)
(52) U.S. Cl. ...................... 324/754; 324/765
(58) Field of Classification Search ............ None
See application file for complete search history.

(56) References Cited

U.S. PATENT DOCUMENTS 5,070,297 A * 12/1991 Kwon et al. ............. 324/754
5,497,079 A * 3/1996 Yamada et al. .......... 324/158.1
5,600,257 A * 2/1997 Leas et al. ............... 324/754
5,701,666 A * 12/1997 DeHaven et al. ........... 29/831
5,781,021 A * 7/1998 Ilani ........................ 324/754
5,838,163 A * 11/1998 Rostoker et al. .......... 324/763
6,005,401 A * 12/1999 Nakata et al. ............ 324/754
6,133,744 A * 10/2000 Yojima et al. ............ 324/754
6,897,670 B2 * 5/2005 Burns ........................ 324/758

* cited by examiner

Primary Examiner—Ernest Karlsen
(74) Attorney, Agent, or Firm—Werner & Axenfeld, PC

(57) ABSTRACT

A replacement for probe cards includes a full wafer contacter. A first surface of the full wafer contacter is brought into contact with, and the contacter is attached to, a wafer, thereby making electrical connection with at least a portion of the contact pads on each of a plurality of integrated circuits on the wafer. The full wafer contacter provides conductive pathways from the IC contact pads to a second surface of the full wafer contacter where a corresponding set of contact pads provide access to test systems and/or other devices. The contact pads on the second surface of the full wafer contacter are typically larger than the contact pads of the integrated circuits, and are typically spaced father apart from each other. The full wafer contacter is constructed to be suitable to provide access to the contact pads of the unsingulated integrated circuits during a wafer burn-in process.

12 Claims, 5 Drawing Sheets

FULL WAFER CONTACTER AND APPLICATIONS THEREOF

RELATED APPLICATIONS

This non-provisional patent application is a continuation in part of application Ser. No. 10/370,393, filed on 19 Feb. 2003 now U.S. Pat. No. 6,991,969, and entitled "Methods and Apparatus for Addition of Electrical Conductors to Previously Fabricated Device"; and further claims the benefit of previously filed co-pending provisional application No. 60/450,607, filed on 28 Feb. 2003, and entitled "Full Wafer Contacter and Applications Thereof", both of which are hereby incorporated by reference.

FIELD OF THE INVENTION

The present invention relates generally to semiconductor manufacturing, and more particularly relates to an apparatus for providing access to electrical terminals of integrated circuits while those integrated circuits are still in wafer form.

BACKGROUND

Integrated circuit manufacturing provides a substantial portion of the electronic components in use today. Although there are many different manufacturing processes for producing a finished integrated circuit, almost all of these processes have certain aspects in common. For example, it is common to fabricate integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits.

Conventional integrated circuit manufacturing processes, typically produce fixed electrically conductive pathways, in the form of lines of metal, metal alloys, or metal laminate stacks. Generally these metal lines are unchangeable by the time a wafer is ready for testing and assembly. In conventional integrated circuit manufacturing processes it is common for terminals, such as those mentioned above to be brought into contact with probes for testing, and further to be contacted with bond wires or solder bumps for connection of the integrated circuit to a package, board, or similar environment.

Probing and testing of integrated circuits while they are still in wafer form can be expensive and difficult. This is a particularly difficult problem for high pin-count integrated circuits.

What is needed are methods and apparatus for lowering the cost of testing integrated circuits that are still in wafer form.

SUMMARY OF THE INVENTION

Briefly, a first surface of a full wafer contacter is brought into contact with, and the full wafer contacter is attached to, a wafer, thereby making electrical connection with at least a portion of the contact pads on each of a plurality of integrated circuits on the wafer. The full wafer contacter provides conductive pathways from the integrated circuit contact pads to a second surface of the full wafer contacter where a corresponding set of contact pads provide access to test systems and/or other devices. The contact pads on the second surface of the full wafer contacter are typically larger than the contact pads of the integrated circuits, and are also typically spaced farther apart from each other.

In a further aspect of the present invention, the full wafer contacter is constructed so as to be suitable to provide access to the contact pads of the unsingulated integrated circuits during a wafer burn-in process.

DETAILED DESCRIPTION

Figure 1:
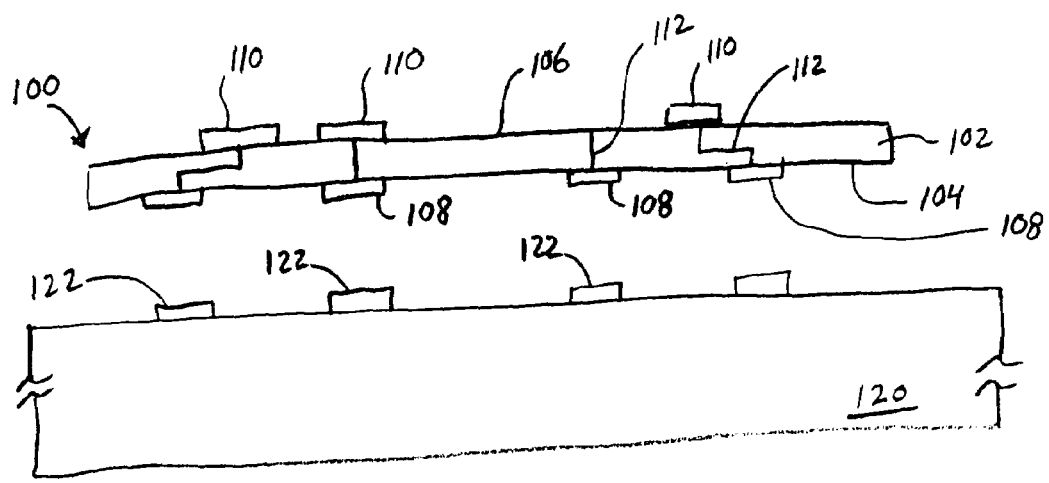
FIG. 1 is a schematic cross-sectional view of a wafer having a plurality of fabricated integrated circuits thereon, and a full wafer contacter, in accordance with the present invention aligned for connection with the substrate.

Various embodiments of the present invention provide a replacement for probe cards used in the process of integrated circuit testing while the integrated circuits are unsingulated, that is, while they are still in wafer form.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Contact pads refer to regions of conductive material, typically a metal, a metal alloy, or a stack structure including several layers of metals and/or metal alloys, that are present, typically, at the uppermost layer of conductive material of an integrated circuit. Such pads are also sometimes referred to as bonding pads, or chip pads, and these terms are well understood in the integrated circuit industry. Contact pads are terminals which provide for electrical connection to be made between the integrated circuit and external devices.

In an alternative method of providing electrical connections to devices external to the integrated circuit, solder bumps, or solder balls, are used rather than the contact pads described above. It is noted that either contact pads, solder bumps, solder balls, or any other form of terminal suitable for external connection that is disposed on an integrated circuit can be used with various embodiments of the present invention.

Several illustrative examples of the present invention are provided in the context of memory integrated circuits. That is, integrated circuits which implement various forms and sizes of memory arrays. It is noted however, that various embodiments of the present invention are applicable to integrated circuits which are formed on substrates such as wafers, regardless of the function which those integrated circuits are designed to implement. As such, various embodiments of the present invention are applicable to integrated circuits including, but not limited to, microprocessors, digital signal processors, and integrated circuits implementing analog or mixed signal functionality.

Conventional approaches to testing a memory wafer include the use of a multi-die probe card, an interface, a docking system, and a tester interface board. Such approaches require precise alignment and expensive maintenance.

In one illustrative example, a wafer containing memory integrated circuits is fitted with a full wafer contacter in accordance with the present invention. The memory die probe pads are approximately 3 mils square.

The full wafer contacter is removably attached to the wafer. The contact sites on the lower, or chip side, of the full wafer contacter make contact with the bonding pads of the die on the wafer. The contact sites on the upper, or tester side, of the full wafer contacter make contact with the pin electronics of a tester. In this way, damage to the bonding pads by a probe card is eliminated. Additionally, alignment of the tester to the upper side of the full wafer contacter is facilitated because those upper side contact sites are larger than the underlying bonding pads found on the chips.

The full wafer contacter may accompany the wafer through burn-in. Even during burn-in, the full wafer contacter may provide electrical contact between the various die on the wafer and any other electrical device. Full wafer contacters may be relatively thin compared to the wafers to which they are attached. In one embodiment the full wafer contacters are approximately 0.004 inches thick. A vacuum formed between a 200 mm wafer and a corresponding full wafer contacter puts up to 700 pounds of pressure on the interface between them (at sea level).

In some embodiments of the present invention the full wafer contacter is removed from the wafer after testing and/or burn-in and then re-used, i.e., removably attached to another wafer.

The Apparatus

Figure 2:
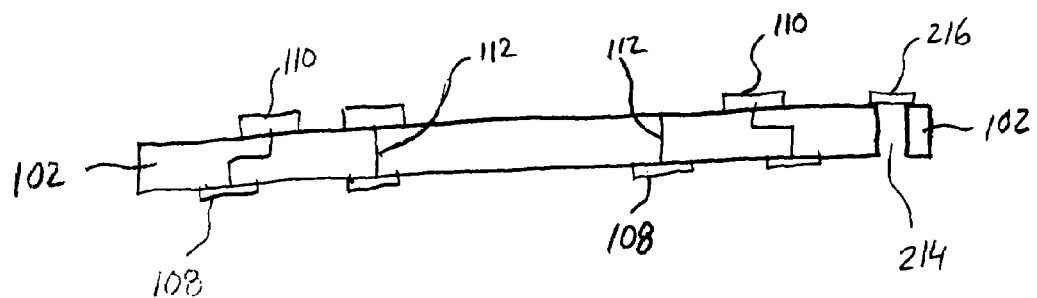
FIG. 2 is a schematic cross-sectional view of a full wafer contacter illustrating an evacuation pathway in accordance with the present invention.

Referring to FIGS. 1 and 2, an exemplary apparatus 100 for providing contact between the contact pads of unsingulated die on a wafer and various external devices in accordance with the present invention is shown. Apparatus 100 typically includes an electrically insulating body 102 having a first major surface 104, and a second major surface 106. Apparatus 100 may be referred to as a full wafer contacter. Insulating body 102 can be made from any thin, flexible dielectric material upon which a conductive material will adhere. A first plurality of electrical contacts 108 is disposed on first major surface 104 of body 102. In some embodiments of apparatus 100, each of the first plurality of electrical contacts 108 has a thickness which is less than a first thickness, and an area less than a first area. Similarly, a second plurality of electrical contacts 110 is disposed on the second major surface 106 of body 102. In some embodiments of full wafer contacter 100, each of the second plurality of electrical contacts 110 has a thickness greater than a second thickness, and an area greater than a second area. It is noted that although the illustrative embodiment of FIG. 1 is shown with electrical contacts 110, it is within the scope of the present invention to provide electrical pathways as well, so that the placement, or arrangement of electrical contacts 110 are not restricted to any particular location on full wafer contacter 100.

It is noted that the electrical pathways and contacts may be made from metal, metal alloys, or any other suitable material for carrying an electrical signal, such as, but not limited to, electrically conductive polymers. Gold, nickel plated copper, and conductive elastomers are examples of materials suitable for forming the electrical contacts and pathways. Similarly, it will be appreciated that optical pathways may be accommodated between an optical output source at the surface of a wafer and the topside of full wafer contacter 100 by providing an optically transmissive pathway, such as an optical fiber, through body 102.

Full wafer contacter 100 further includes a plurality of electrical vias 112 disposed in body 102, between first major surface 104 and second major surface 106 so as to provide electrically conductive paths between at least a portion of the first plurality electrical contacts 108 and a corresponding portion of the second plurality of electrical contacts 110. In the illustrative embodiment of FIGS. 1 and 2, full wafer contacter 100 further includes an evacuation pathway 114 disposed in electrically insulating body 102, and an evacuation pathway sealing means 216 coupled to evacuation pathway 214. In the illustrative embodiment, evacuation pathway sealing means 216 is adapted for connection to a pressure differential source (not shown). It is noted that a pressure differential source may be a vacuum source. Attachment by this means may be referred to as vacuum attaching. It is further noted that evacuation sealing means 216 may be a mechanical valve. In one illustrative embodiment the valve is a built-in flapper valve. Alternatively, evacuation sealing means 216 may be an adhesive tape. In some embodiments of the present invention which use an adhesive tape as evacuation sealing means 216, the adhesive tape may be removably attachable.

As can be seen in the figures, vias 112 need not have pathways that are solely perpendicular to major surfaces 104, 106. In fact, as indicated in the figures, at least some vias 112 have at least a portion of their paths in a direction of travel that is parallel to major surfaces 104, 106. Full wafer contacter 100 may have one or more intermediate layers of conductive interconnect lines.

It is noted that more than one evacuation pathway may be present in a full wafer contacter. Further, in those instances where a plurality of evacuation pathways are present in a full wafer contacter, more than one evacuation pathway may be employed in evacuating air, or other gases, from between the full wafer contacter and the wafer.

In an alternative embodiment, a membrane pump, rather than a pressure differential source, may be used in connection with evacuation pathway 214. Such a membrane pump is known to operate by means of preferentially passing in one direction, the gas or gases to be removed. In one embodiment of the present invention which utilizes the membrane pump, an inert gas such as, but not limited to nitrogen, is introduced into the space between the wafer and the full wafer contacter. In one embodiment of the present invention, the inert gas is introduced at a pressure that is less than atmospheric pressure. This can be used as a maintenance feature by which undesired atmospheric components are preferentially kept out of the space between the wafer and the full wafer contacter, and/or lower pressure is maintained.

Full wafer contacter 100 is adapted for attachment to a substrate such as wafer 120 shown in FIG. 1. It is noted that the full wafer contacter is typically thinner than the wafer to which it will be attached. It is further noted that full wafer contacter 100 typically has an outer perimeter that fits within an outer perimeter of wafer 120 when full wafer contacter 100 is centered over wafer 120. A plurality of electrical contacts 122 of various integrated circuits disposed on wafer 120 are also illustrated in FIG. 1. It can be seen that full wafer contacter 100 and wafer 120 have been aligned so that when attached, the electrical contacts may be appropriately made. FIG. 1 also illustrates an embodiment of the present invention in which full wafer contacter 100 has a diameter that is less than that of wafer 120. The assembly formed by the attachment, either permanent or removable, of the full wafer contacter to the wafer, may be used in various operations in which the wafer alone normally participates. By way of example, and not limitation, the assembly may be used for burn-in, wafer probe (i.e., the testing of integrated circuits while still in wafer form), and general wafer transportation and wafer handling. That is, for many purposes, the assembly comprising the wafer and the attached full wafer contacter, may be treated in the same manner as a wafer. The wafer effectively provides support for the full wafer contacter.

Figure 3:
FIG. 3 is a schematic cross-sectional view of a full wafer contacter showing a circumferential groove suited for receiving a sealing ring.

Referring to FIG. 3, a schematic cross-sectional view of a full wafer contacter 100 shows a circumferential groove 302 suited for receiving a sealing ring. A sealing ring may be an O-ring. In one embodiment of the present invention, the O-ring may be seated in groove 302 prior to the attachment of full wafer contacter 100 to the wafer.

Alternatively, the sealing ring may be formed of a material (e.g., a silicone gel) such that a substantially air-tight seal is formed when the air, or other gas, is partly or completely removed from between full wafer contacter 100 and the wafer. It is desirable that a sealing ring material of this type have a set of characteristics such that the material does not adversely impact the operational, or functional, aspects of any of the integrated circuits of the wafer. For example, a low ionic concentration silicone that is specifically made for direct wafer contact without adhesion. That is, it is preferable for the adherence of the silicone to the full wafer contacter be greater than the adherence of the silicone to the wafer.

In alternative configurations of the present invention, a sealing gasket may be disposed between the full wafer contacter and the wafer without a groove being present in the full wafer contacter to receive the sealing gasket.

Figure 4:
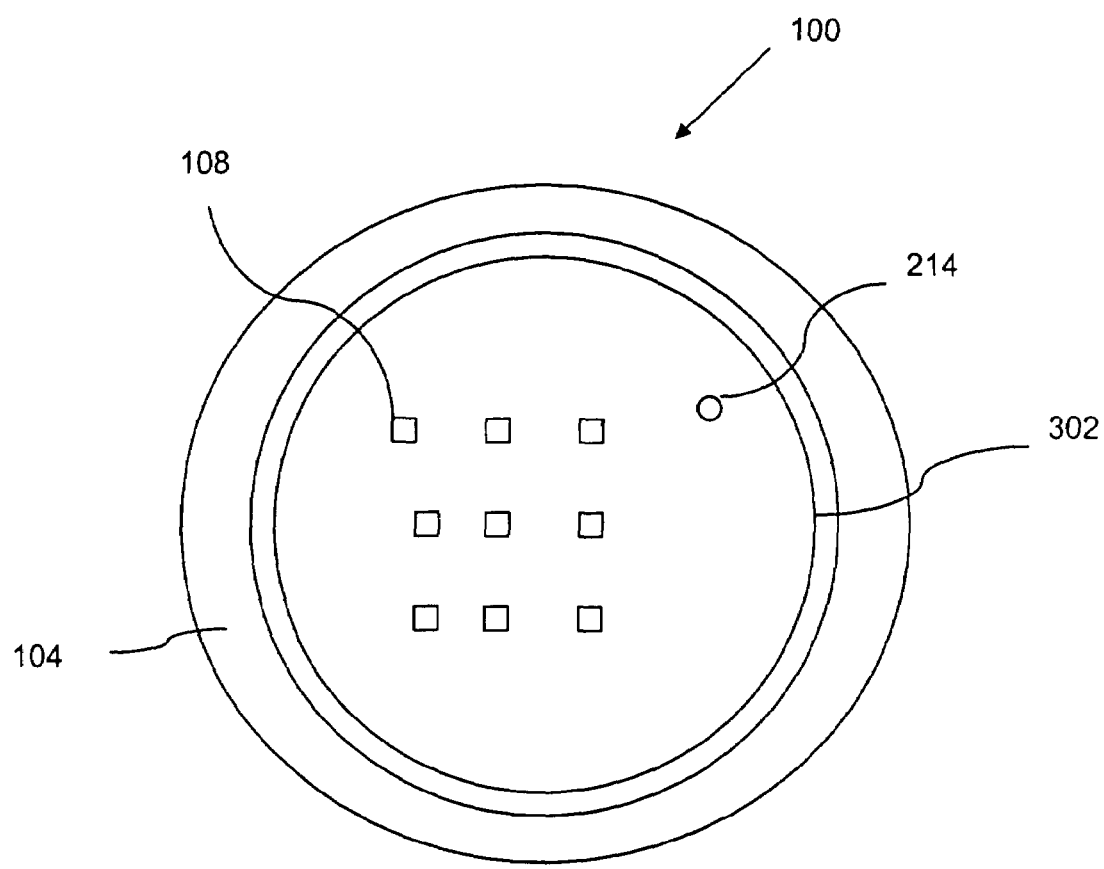
FIG. 4 is a schematic bottom view of a full wafer contacter illustrating a circumferential groove, placement of an evacuation pathway port, and an array of bottom-side contact sites.

Referring to FIG. 4, a schematic bottom view of full wafer contacter 100 is presented which generally shows first major surface 104, and more particularly shows circumferential groove 302, a port of evacuation pathway 214, and an array of bottom-side electrical contacts 108. The array of bottom-side electrical contacts are typically arranged so as to correspond to the physical layout of the electrical terminals of the wafer with which contact is to be made.

Figure 5:
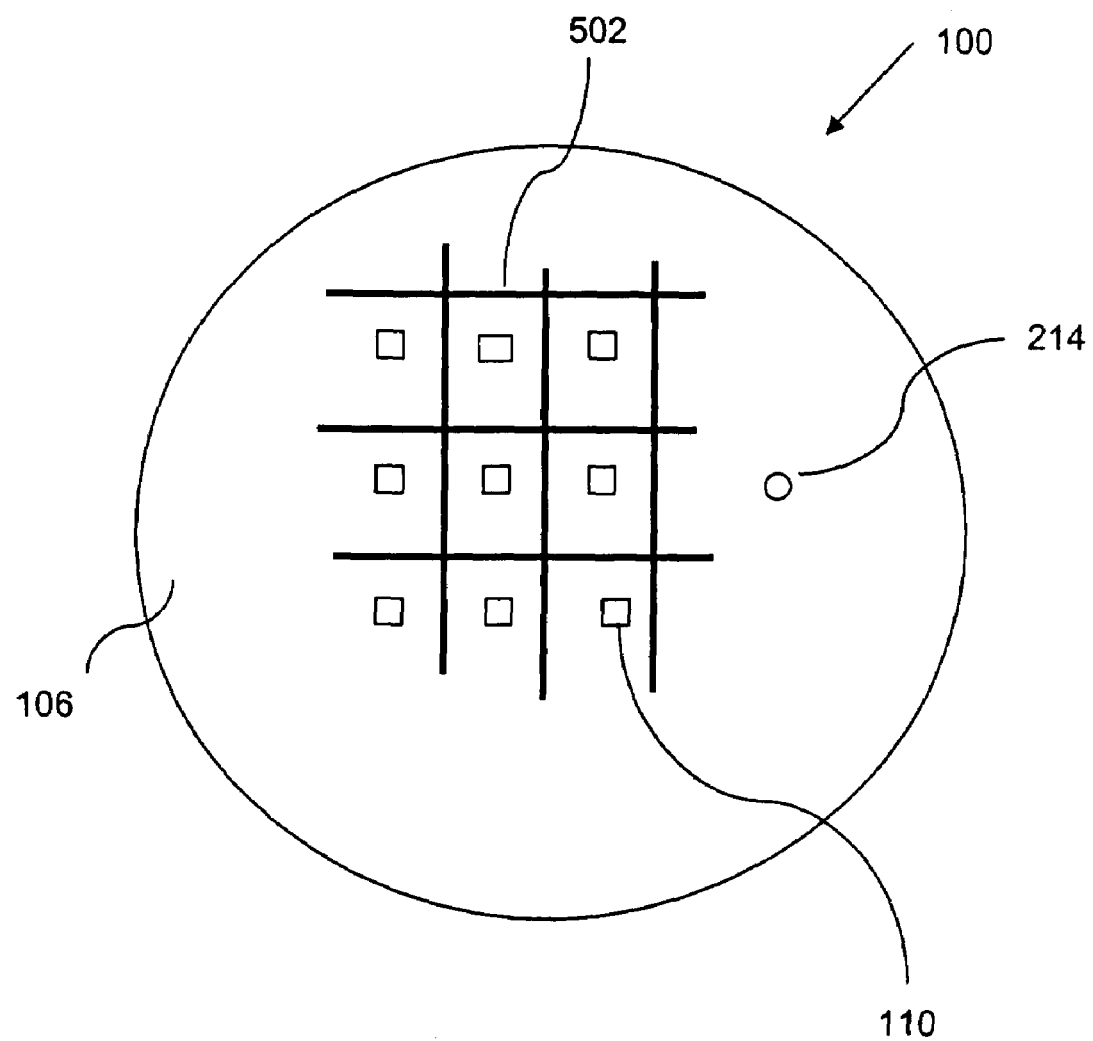
FIG. 5 is schematic top view of a full wafer contacter illustrating placement of an evacuation pathway port, an array of top-side contact sites, and a street map suitable for providing guidance to a wafer sawing operation.

Referring to FIG. 5, a schematic top view of full wafer contacter 100 is presented which generally shows second major surface 106, and more particularly shows a port of evacuation pathway 214, an array of top-side electrical contacts 110, and a street map 502 suitable for providing guidance to a wafer sawing operation. In conventional integrated circuit manufacturing processes, a space, or scribe street, is formed between each of the integrated circuits on the wafer. This space is sometimes referred to as a scribe channel, a scribe alley, a scribe lane, or a scribe street. Regardless of the name used, these spaces form the paths through which the wafer is cut, so as to singulate, or separate, the individual integrated circuits. The process of separating the individual integrated circuits from the wafer may be referred to as cutting, sawing, or scribing. In order to properly perform the process of separating, it is preferable that the scribe street be visible so that the cutting mechanism (i.e., saw, laser, etc.) may be properly aligned to the wafer. However, the scribe streets are not normally visible once a full wafer contacter is attached to the wafer. To overcome this lack of visibility, the full wafer contacter may be provided with a "street map" 502 to guide the separation, i.e., singulation, process. Street map 502 corresponds to the scribe streets of the wafer attached to the underside 104 of full wafer contacter 100. Since full wafer contacter 100 is aligned to the underlying wafer, a cutting, or sawing operation can be guided by the visible markings provided by full wafer contacter 100. In this way, the wafer may be cut with the full wafer contacter attached.

In one embodiment of the present invention, street map 502 is formed of the same material as electrical contacts 110. In an alternative embodiment, street map 502 is formed by etching trenches into surface 106. In a still further embodiment, street map 502 is formed from ink, paint, or similarly observable marking materials.

Figure 6:
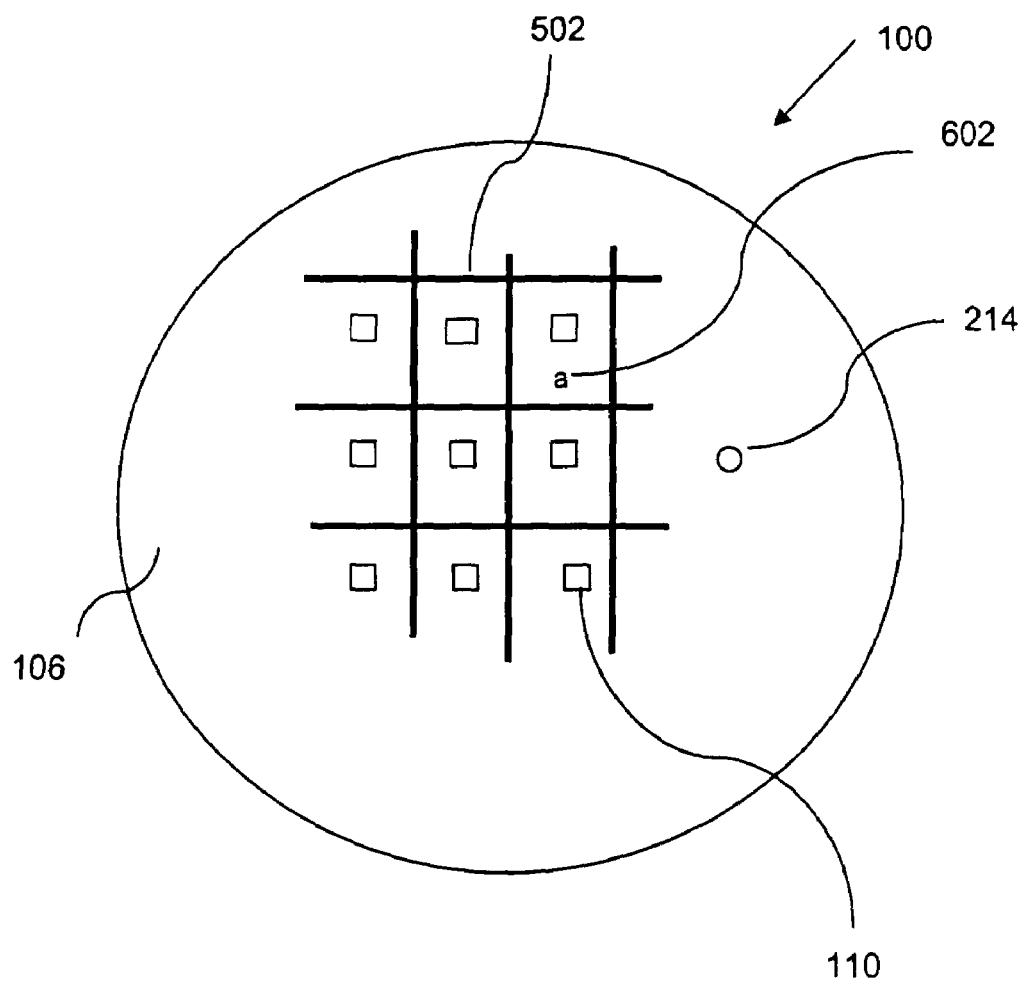
FIG. 6 is schematic top view of a full wafer contacter illustrating placement of an evacuation pathway port, an array of top-side contact sites, a street map suitable for providing guidance to a wafer sawing operation, and observable information included at a location corresponding to the location of the information on a corresponding wafer.

In a manner similar to the formation of street map 502 on an upper surface of full wafer contacter 100, other useful information may be provided so as to be observable on the upper surface of full wafer contacter 100. For example, some integrated circuit manufacturing processes include marking individual integrated circuits with codes, or other such identifying information. Such marking may be done by laser scribing as is known in this field. In one embodiment of the present invention, the information that has been scribed, or otherwise formed, on integrated circuits of the wafer, is scanned, and reproduced on the upper surface of full wafer contacter 100. In one embodiment, the positional integrity of the scanned information is maintained. In other words, the scanned information is rewritten at locations on the upper surface of full wafer contacter 100 that correspond to the locations on the wafer from which the information was obtained. FIG. 6 illustrates the provision of information on the upper surface of full wafer contacter 100. Referring to FIG. 6, information is shown as text 602.

As illustrated in FIGS. 4 and 5, typical embodiments of the present invention include full wafer contacters that are substantially circular. By providing a shape that reflects that of the substrate to which it will be attached, embodiments of the present invention are well suited to provide connection to circuits throughout the underlying substrate. Those skilled in the art and having the benefit of the present disclosure will appreciate that full wafer contacters in accordance with the present invention may have other shapes.

Alternative Arrangements

As described above in connection with FIGS. 2 and 3, a full wafer contacter may be maintained in connection with a wafer through the establishment and maintenance of a pressure differential. In alternative embodiments of the present invention, a full wafer contacter may be attached to the wafer, either permanently or removably, through the use of various adhesives. For a permanent attachment, a suitable adhesive is one which bonds the material of the full wafer contacter to the wafer. Such an adhesive connection may be made between the wafer and the insulating portion of the full wafer contacter, or between the wafer and a conductive portion of the full wafer contacter. Similarly, a material which facilitates adhesion may be integrated into the full wafer contacter, the wafer, or both. For a removable attachment, a suitable adhesive is one which bonds the material of the full wafer contacter to the wafer, and which is dissolvable in a solvent that does not adversely affect the operational characteristics of the integrated circuits disposed on the wafer.

In a further alternative arrangement, an adhesive, or bonding, material used for attaching a full wafer contacter to a wafer, may be heat or light activated. It is noted that such an adhesive, within the scope of the present invention, may also be deactivated by heat or light.

In a still further alternative arrangement, a full wafer contacter is attached to a wafer by means of solder bumps disposed between the full wafer contacter and the wafer. Bonding between the full wafer contacter and the wafer may be achieved by heating the solder bumps with laser energy. A laser may be directed through the full wafer contacter such that energy is deposited in a solder bump, or solder ball, disposed between a contact pad of the full wafer contacter and a contact pad of the wafer. A plurality of such soldered contacts serves to bond the full wafer contacter to the wafer.

Full wafer contacters in accordance with the present invention may advantageously be used for probing (i.e., testing) multi-project wafers. While most semiconductor manufacturing produces wafers that contain a plurality of identical integrated circuits, multi-project wafers are wafers upon which a number of non-identical integrated circuits are fabricated. Since most chips that are not identical tend to have different contact pad layouts, they would require either a non-optimal pad layer metal layout so that these chips all could use the same probe card, or they would have to be tested in separate passes with different probe cards, or they would have to skip wafer probe altogether. However, the full wafer contacter in accordance with the present invention allows each of the different chip designs on a multi-project wafer to have its own optimal pad layer metal layout, while still providing simultaneous access to those contact pads. The full wafer contacter achieves this by having the contact pads on its wafer contact side match the layouts of all the contact pads of interest on the wafer itself. Electrical pathways through the body of the full wafer contacter then provide, on the tester contact side, larger pads and/or larger spacings so that convenient access is provided to each of the integrated circuits on the multi-project wafer without having to change probe cards, and without requiring arbitrary pad layouts. It is noted that, in this way, full wafer contacter in accordance with the present invention can provide simultaneous connection to integrated circuits having not only different pad layouts, but simultaneous connection to the pads of integrated circuits having different die sizes.

CONCLUSION

Various embodiments of the present invention include apparatus and methods for simultaneously making electrical contact with the pads of a plurality of integrated circuits while those integrated circuits are still in wafer form, that is, unsingulated.

Embodiments of the present invention may find application in the testing of integrated circuits. Such embodiments provide access to one or more of the integrated circuits on a wafer while eliminating the need for expensive, high precision, probe cards.

An advantage of some embodiments of the present invention includes effectively improving chip pad durability by presenting the tester interface with an alternative contact pad, and thereby allowing multiple touchdowns without damage to the bonding pads of a chip.

Another advantage of some embodiments of the present invention includes increasing the pad size presented to the tester interface.

Another advantage of some embodiments of the present invention includes increasing the pad pitch presented to the tester interface.

Another advantage of some embodiments of the present invention includes presenting the tester interface with pads comprising materials such as gold, or nickel plated copper, while allowing the chip pads to remain aluminum, resulting in a simpler, less expensive to manufacture chip pad metallurgy.

Another advantage of some embodiments of the present invention includes increasing the positioning tolerance for reliable wafer contact.

Another advantage of some embodiments of the present invention includes making simultaneous contact to pads of different integrated circuits on a multi-project wafer, where those integrated circuits have different pad layouts.

It is to be understood that the present invention is not limited to the embodiments described above, but encompasses any and all embodiments within the scope of the subjoined claims and their equivalents.

What is claimed is:

1. A method of electrically accessing a plurality of integrated circuits, each integrated circuit having a plurality of terminals, the method comprising:
    providing a wafer having a first and a second major surface, the plurality of integrated circuits disposed on a first major surface thereof, each of the plurality of integrated circuits having a plurality of terminals, and the plurality of integrated circuits disposed over at least a portion of the first major surface;
    providing a full wafer contacter having a first major surface and a second major surface, a first plurality of contact terminals disposed on the first major surface of the full wafer contacter in a pattern that corresponds to the terminal layout of the plurality of integrated circuits; and
    removably attaching the full wafer contacter to the wafer such that the first major surface of the wafer and the first major surface of the full wafer contacter are facing each other, the sealing ring is in contact with the full wafer contactor and the wafer, and such that at least a portion of the terminals of the integrated circuits are in electrical contact with the first plurality of contact terminals;
    wherein each of the first plurality of contact terminals is electrically coupled to a corresponding one of a second plurality of contact terminals disposed on the second major surface of the full wafer contacter.

2. The method of claim 1, wherein removably attaching comprises vacuum attaching.

3. The method of claim 1, wherein removably attaching comprises producing a low pressure zone between the full wafer contacter and the wafer.

4. The method of claim 3, wherein removably attaching comprises, in an atmosphere containing one or more gases, placing the full wafer contacter over the wafer, and evacuating at least a portion of the one or more gases disposed between the full wafer contacter and the wafer.

5. The method of claim 1, wherein the integrated circuit terminals comprise bonding pads.

6. The method of claim 1, wherein the integrated circuit terminals comprise solder bumps.

7. The method of claim 1, further comprising aligning the full wafer contacter to the wafer such that the terminals of the integrated circuits and the terminals disposed on the first major surface of the full wafer contacter will be in electrical contact when the full wafer contacter is removably attached to the wafer.

8. The method of claim 1, wherein a first portion of the plurality of integrated circuits has a first terminal layout pattern, and a second portion of the plurality of integrated circuits has a second terminal layout pattern, and the first and second terminal layout patterns are different.

9. The method of claim 1, wherein each of the first portion of the plurality of integrated circuits has a first die size, and each of the second portion of the plurality of integrated circuits has a second die size, and the first and second die sizes are different.

10. The method of claim 1, wherein the wafer has a first area, the full wafer contacter has a second area, and the first area is greater than the second area.

11. The method of claim 1, wherein the full wafer contacter is thinner than the wafer.

12. The method of claim 1, further comprising introducing an inert gas between the full wafer contacter and the wafer.

* * * * *